(12) United States Patent
Nishio et al.

(10) Patent No.: US 12,720,826 B2
(45) Date of Patent: Aug. 25, 2026

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Johji Nishio, Tokyo (JP); Tatsuo Shimizu, Tokyo (JP); Chiharu Ota, Kawasaki (JP); Ryosuke Iijima, Tokyo (JP)

(73) Assignee: KABUSHIKI KAISHA TOSHIBA, Kawasaki Kanagawa (JP)

( * ) Notice: Subject to any disclaimer, the term of this patent is extended or adjusted under 35 U.S.C. 154(b) by 481 days.

(21) Appl. No.: 18/365,681

(22) Filed: Aug. 4, 2023

(65) Prior Publication Data

US 2024/0266400 A1 Aug. 8, 2024

(30) Foreign Application Priority Data

Feb. 2, 2023 (JP) ................................. 2023-014710

(51) Int. Cl.
*H01L 29/10* (2006.01)
*H10D 30/66* (2025.01)
*H10D 62/17* (2025.01)
*H10D 62/832* (2025.01)
*H10P 30/20* (2026.01)

(52) U.S. Cl.
CPC ........... *H10D 62/393* (2025.01); *H10D 30/66* (2025.01); *H10D 62/8325* (2025.01); *H10P 30/2042* (2026.01); *H10P 30/21* (2026.01)

(58) Field of Classification Search
CPC .. H10D 62/393; H10D 30/66; H10D 62/8325; H01L 21/046
See application file for complete search history.

(56) References Cited

U.S. PATENT DOCUMENTS

2014/0209927 A1 7/2014 Nishio et al.
2016/0247884 A1* 8/2016 Ohashi ................ H10D 64/661
(Continued)

FOREIGN PATENT DOCUMENTS

JP 2014-146748 A 8/2014
JP 2017-195333 A 10/2017
(Continued)

OTHER PUBLICATIONS

Shunta Harada et al., “Suppression of stacking fault expansion in a 4H—SiC epitaxial layer by proton irradiation”, Scientific Reports, vol. 12, Art. 13542, 8 pages, https://doi.org/10.1038/s41598-022-17060-y (2022).

(Continued)

*Primary Examiner* — William C Trapanese

(74) *Attorney, Agent, or Firm* — Finnegan, Henderson, Farabow, Garrett & Dunner, LLP

(57) ABSTRACT

According to one embodiment, a semiconductor device includes a base, a first silicon carbide region, and a second silicon carbide region. The first silicon carbide region includes at least one selected from the group consisting of nitrogen, phosphorus and arsenic. The second silicon carbide region includes at least one selected from the group consisting of boron, aluminum and gallium. The first silicon carbide region is provided between the base and the second silicon carbide region. At least a part of the first silicon carbide region includes fluorine.

15 Claims, 5 Drawing Sheets

(56) References Cited

U.S. PATENT DOCUMENTS

| | | | | |
|---|---|---|---|---|
| 2018/0301536 | A1* | 10/2018 | Utsumi ................ | H10D 30/668 |
| 2019/0172943 | A1 | 6/2019 | Sakai et al. | |
| 2020/0251560 | A1 | 8/2020 | Nishio et al. | |
| 2023/0378292 | A1 | 11/2023 | Uehara et al. | |

FOREIGN PATENT DOCUMENTS

| | | | |
|---|---|---|---|
| JP | 6244826 | B2 | 12/2017 |
| JP | 2019-46979 | A | 3/2019 |
| JP | 2020-126919 | A | 8/2020 |
| JP | 2022-151776 | A | 10/2022 |

OTHER PUBLICATIONS

Shunta Harada et al., "Suppression of partial dislocation glide on the basal plan in SiC epitaxial layer by proton implantation," 83rd JSAP Autumn Meeting, 20p-C306-4, 1 page, and translation, 2 pages (2022).

O. Watanabe et al., "Suppression of stacking fault expansion in SiC PiN diodes by H+ implantation," 83rd JSAP Autumn Meeting, 20p-C306-5, 1 page, and translation, 2 pages (2022).

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent No. 2023-014710, filed on Feb. 2, 2023; the entire contents of which are incorporated herein by reference.

FIELD

Embodiments of the invention generally relate to a semiconductor device and a method for manufacturing the same.

BACKGROUND

For example, there is a semiconductor device including silicon carbide. Semiconductor devices are desired to have stable characteristics.

DETAILED DESCRIPTION

Figure 1:
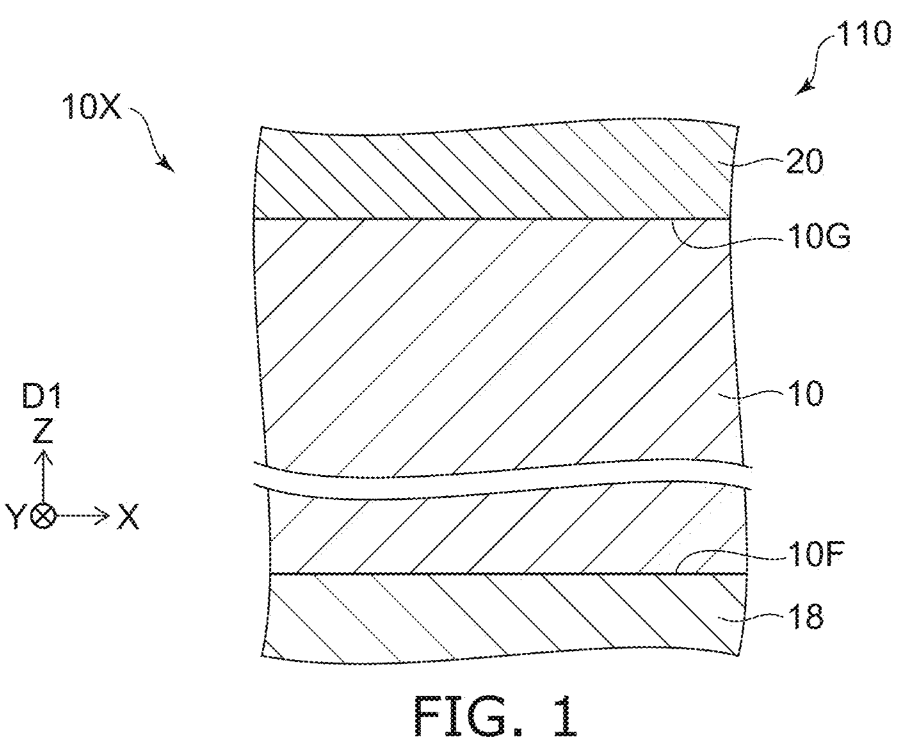
FIG. 1 is a schematic cross-sectional view illustrating a semiconductor device according to a first embodiment.

According to one embodiment, a semiconductor device includes a base, a first silicon carbide region, and a second silicon carbide region. The first silicon carbide region includes at least one selected from the group consisting of nitrogen, phosphorus and arsenic. The second silicon carbide region includes at least one selected from the group consisting of boron, aluminum and gallium. The first silicon carbide region is provided between the base and the second silicon carbide region. At least a part of the first silicon carbide region includes fluorine.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a base 18, a first silicon carbide region 10, and a second silicon carbide region 20.

The base 18 includes, for example, silicon carbide (SiC). The base 18 may be, for example, a silicon carbide substrate. The base 18 is, for example, a silicon carbide bulk single crystal substrate. In one example, the silicon carbide included in the base 18 is 4H-SiC. The base 18 may comprise 3C-SiC. The conductivity type of the base 18 is arbitrary.

The first silicon carbide region 10 and the second silicon carbide region 20 include SiC. The first silicon carbide region 10 and the second silicon carbide region 20 may include, for example, 3C-SiC.

The first silicon carbide region 10 includes a first impurity. The first impurity includes at least one selected from the group consisting of nitrogen, phosphorus and arsenic. The first silicon carbide region 10 is of an n-type.

The second silicon carbide region 20 includes a second impurity. The second impurity includes at least one selected from the group consisting of boron, aluminum and gallium. The second silicon carbide region 20 is of a p-type. The first silicon carbide region 10 is provided between the base 18 and the second silicon carbide region 20.

A first direction D1 from the base 18 to the first silicon carbide region 10 is defined as a Z-axis direction. One direction perpendicular to the Z-axis direction is defined as an X-axis direction. A direction perpendicular to the Z-axis direction and the X-axis direction is defined as a Y-axis direction.

The first silicon carbide region 10 and the second silicon carbide region 20 are layered along the X-Y plane. The first silicon carbide region 10 includes a first face 10F. The first face 10F faces the base 18. As will be described later, the first face 10F may be inclined with respect to the crystal plane of the base 18 (for example, the (0001) plane). The first silicon carbide region 10 may include second face 10G. The first face 10F is located between the base 18 and the second face 10G. The second face 10G faces the second silicon carbide region 20.

At least a part of first silicon carbide region 10 includes fluorine. This provides stable characteristics.

For example, the base 18 includes base plane dislocations (BPDs). Based on the base plane dislocations of the base 18, the base plane dislocations occur in the first silicon carbide region 10. During operation of the semiconductor device, a stacking fault extends from the base plane dislocations to the first silicon carbide region 10. The stacking fault is, for example, a single Shockley stacking fault.

For example, when holes are injected into the n-type silicon carbide semiconductor device, the stacking fault starting from BPDs are expanded. As a result, forward characteristics tend to deteriorate. Furthermore, when the partial dislocation of the stacking fault reaches the p-type semiconductor region, the leakage current increases in the reverse characteristic. This causes a breakdown voltage failure.

It has been found that the first silicon carbide region 10 including fluorine can suppress the expansion of the stacking fault starting from BPDs. Thereby, the deterioration of characteristics due to the expansion of the stacking fault can be suppressed. According to the embodiments, it is possible to provide a semiconductor device capable of stabilizing characteristics.

In the operation of semiconductor device 110, an electric field tends to concentrate at the interface between the first silicon carbide region 10 and the second silicon carbide region 20. By introducing fluorine to a position deeper than the interface (for example, the second face 10G), the expansion of the stacking fault is suppressed in the vicinity of the position where the electric field concentrates. Fluctuations in characteristics are effectively suppressed.

Figure 2:
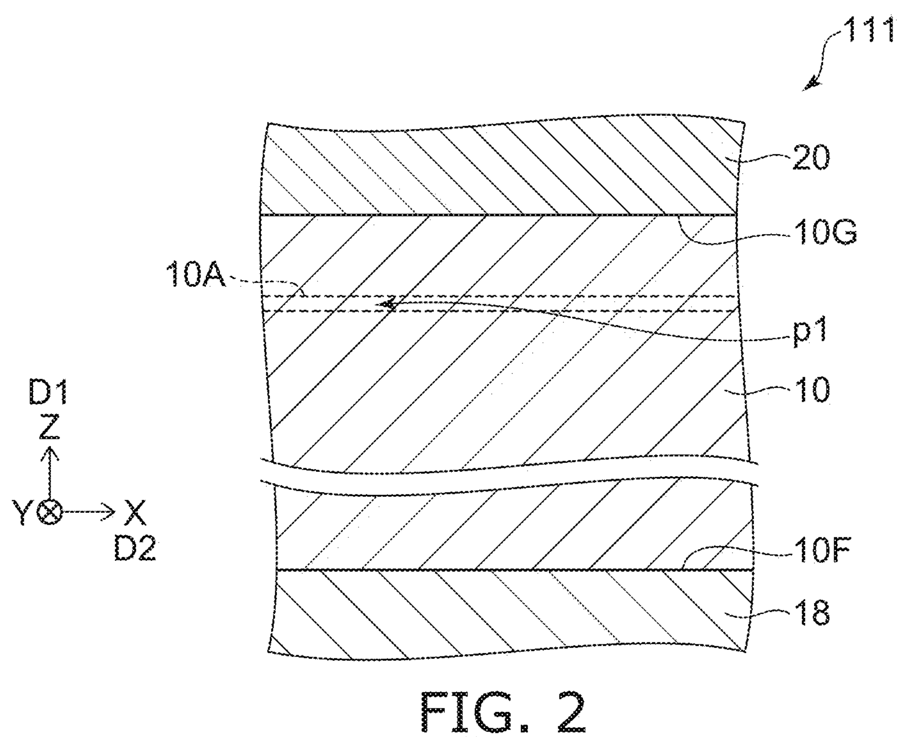
FIG. 2 is a schematic cross-sectional view illustrating a semiconductor device according to the first embodiment.

FIG. 2 is a schematic cross-sectional view illustrating a semiconductor device according to the first embodiment.

As shown in FIG. 2, in a semiconductor device 111 according to the embodiment, the first silicon carbide region 10 includes a first local region 10A. The fluorine concentration is locally high in the first local region 10A. The first local region 10A may extend parallel to a plane crossing the first direction D1 (for example, the X-Y plane). A position of the first local region 10A in the Z-axis direction is between an interface portion between the first silicon carbide region 10 and the second silicon carbide region 20, and base 18.

Figure 3:
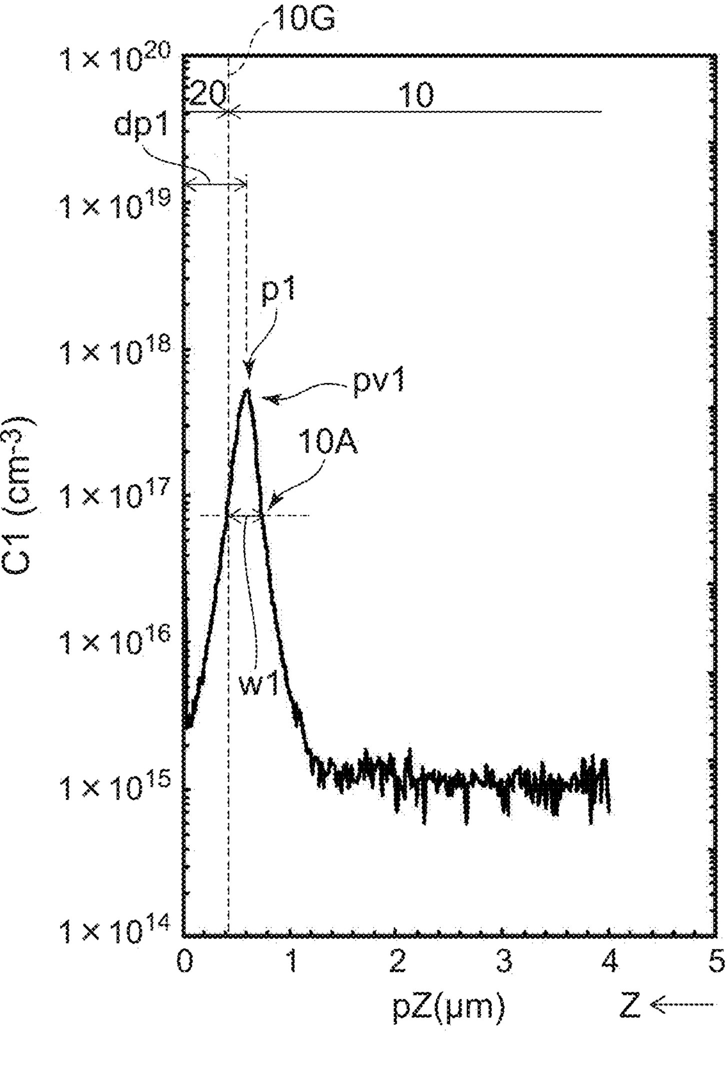
FIG. 3 is a graph illustrating the semiconductor device according to the first embodiment.

FIG. 3 is a graph illustrating the semiconductor device according to the first embodiment.

FIG. 3 shows SIMS (Secondary Ion Mass Spectrometry) analysis results for the semiconductor device 111. The horizontal axis of FIG. 3 is the position pZ in the Z-axis direction. The vertical axis is fluorine concentration C1.

As shown in FIG. 3, the first silicon carbide region 10 includes a first position p1 in the Z-axis direction (first direction D1). In the profile of the fluorine concentration C1 along the first direction D1, the fluorine concentration C1 has a first peak value pv1 at the first position p1. The first local region 10A includes such a first position p1.

Such a first local region 10A can be formed, for example, by fluorine ion implantation from a side of the second silicon carbide region 20. By the ion implantation, fluorine can be effectively implanted at a high concentration at a target depth position (first position p1).

In the example of FIG. 3, the first peak value pv1 of the fluorine concentration C1 is approximately $5\times10^{17}$ $cm^{-3}$. In the embodiment, the first peak value pv1 may be not less than $1\times10^{16}$ $cm^{-3}$ and not more than $1\times10^{20}$ $cm^{-3}$. Fluorine can effectively suppress the expansion of the stacking fault.

For example, the fluorine concentration C1 in the first local region 10A may be not less than 1/10 times the first peak value pv1. In one example, a width w1 in the first direction D1 of the first local region 10A may be 0.5 μm or less.

A distance dp1 along the Z-axis direction between the first position p1 and the second face 10G is preferably 2 μm or less, for example. More preferably, the distance dp1 is, for example, 1 μm or less. The first position p1 is included in first silicon carbide region 10.

In embodiments, fluorine may be provided in the first silicon carbide region 10 with a broad concentration profile. In the embodiment, the profile of the fluorine concentration C1 may not have a distinct peak at the first position p1. For example, the fluorine concentration C1 is $1\times10^{16}$ $cm^{-3}$ or more at one position included in the region where the distance from the second face 10G is 1 μm or less. The fluorine concentration C1 at the one position is higher than the fluorine concentration C1 at a distance of 2 μm from the second face 10G. In such a configuration as well, the expansion of the stacking fault can be suppressed.

The fluorine may be introduced locally as illustrated in FIG. 3. A desired concentration of fluorine can be introduced into the first silicon carbide region 10 with high controllability.

As described above, fluorine is introduced into the first silicon carbide region 10 through the second silicon carbide region 20 by ion implantation. Fluorine can be effectively introduced to a relatively deep position. It is difficult for other elements (such as chlorine, for example) to reach the depth of first silicon carbide region 10. By using fluorine as an element to be introduced, fluorine can be efficiently introduced to a desired position.

FIGS. 4A to 4D are schematic plan views illustrating characteristics of the semiconductor device.

Figures 4A, 4B, 4C, 4D:
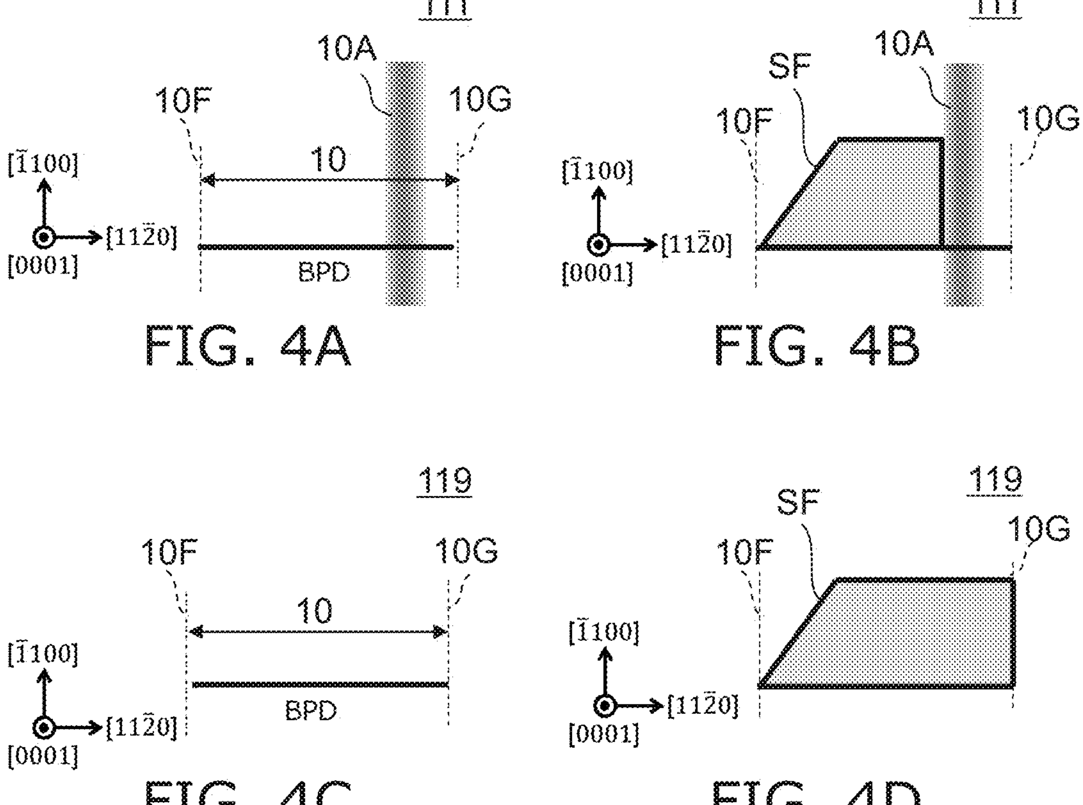
FIGS. 4A to 4D are schematic plan views illustrating characteristics of the semiconductor device.

FIGS. 4A and 4B correspond to the semiconductor device 111 according to the embodiment. FIGS. 4C and 4D correspond to a semiconductor device 119 of a reference example. In the semiconductor device 119, the first silicon carbide region 10 does not include fluorine. In the semiconductor device 119, the first local region 10A is not provided. These figures schematically illustrate photoluminescence images. By irradiating the semiconductor device with ultraviolet light, it is possible to determine whether or not the BPD expands to form the stacking fault. FIGS. 4A and 4C correspond to the state before ultraviolet light irradiation. FIGS. 4B and 4D correspond to the state after ultraviolet light irradiation.

As shown in FIGS. 4C and 4D, in the semiconductor device 119 of the reference example, the stacking fault SF starting from the BPD expands due to the irradiation with ultraviolet light. The stacking fault SF reaches the second face 10G.

On the other hand, as shown in FIGS. 4A and 4B, in the semiconductor device 111 according to the embodiment, although the stacking fault SF expands when irradiated with ultraviolet light, the stacking fault SF does not extend beyond the first local region 10A. The stacking fault SF does not reach the second face 10G and does not reach the second silicon carbide region 20.

When the stacking fault SF expands and reaches the second silicon carbide region 20 of p-type, the leakage current in the reverse direction increases through the stacking fault SF as a path. In the embodiment, the stacking fault SF is suppressed from reaching the second face 10G and the second silicon carbide region 20. Leakage current paths are suppressed. Thereby, stable characteristics can be obtained.

For example, between the base 18 and the first local region 10A, at least one of voltage application or ultraviolet irradiation expands the stacking fault. Between the first local region 10A and second silicon carbide region 20, the stacking fault is not substantially expanded by at least one of voltage application or ultraviolet irradiation. By providing the region including fluorine (for example, the first local region 10A), the expansion of the stacking fault can be suppressed in a region above the region including fluorine.

Figure 5:
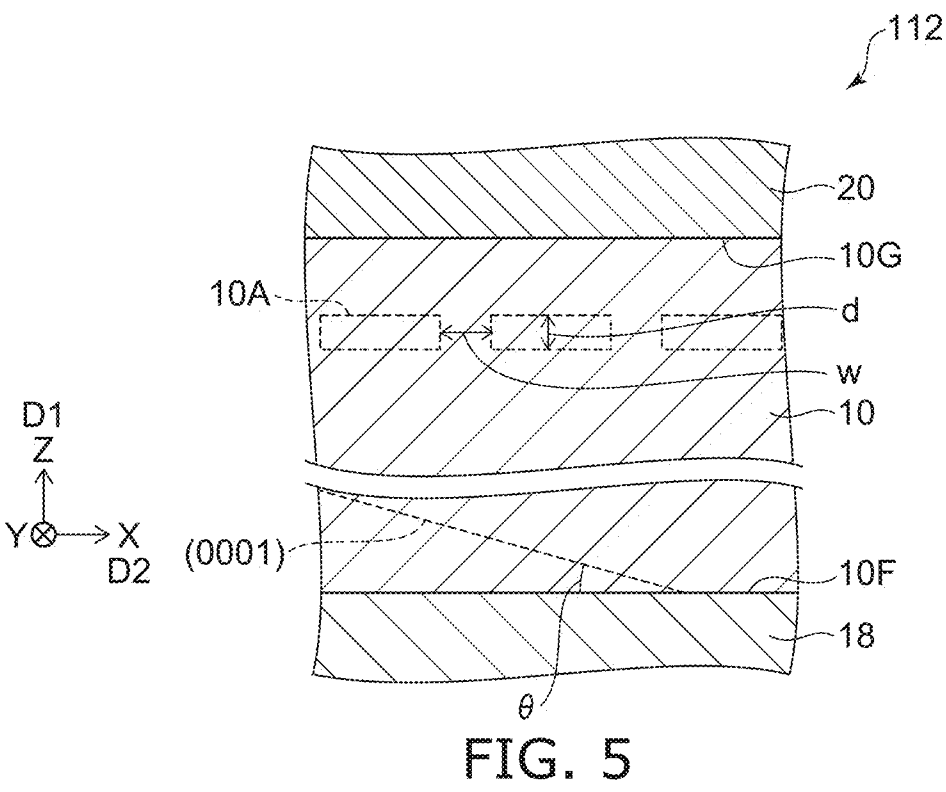
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, in a semiconductor device 112 according to the embodiment, the first silicon carbide region 10 includes a plurality of first local regions 10A. At least one of the plurality of first local regions 10A includes the first position p1 (the position where the fluorine concentration C1 peaks). The plurality of first local regions 10A are provided along a plane (for example, the XY plane) crossing the first direction D1.

For example, the plurality of first local regions 10A being island-shaped may be provided. For example, the plurality of first local regions 10A being striped may be provided.

As shown in FIG. 5, the first silicon carbide region 10 includes a first face 10F facing the base 18. An angle between the (0001) plane of the first silicon carbide region 10 and the first face 10F is defined as an angle θ. The angle θ may be greater than zero. The angle θ may be, for example, not less than 1 degree and not more than 10 degrees. The angle θ corresponds to the offset angle.

A thickness of the plurality of first local regions 10A along the first direction D1 is defined as a thickness "d". A distance between the plurality of first local regions 10A along a second direction D2 crossing the first direction D1 is defined as a distance "w". The second direction D2 is, for example, the X-axis direction.

In embodiments, the angle "θ", thickness "d", and the distance "w" may satisfy the relationship of $w<(d/(\tan\theta))$, for example. As a result, it is possible to suppress the BPD from the base 18 from passing between the plurality of the first local regions 10A and from extending upward. For example, the BPD from the base 18 collides with one of the plurality of first local regions 10A. When the BPD collides with the one of the plurality of first local regions 10A, the expansion of the stacking results starting from the BPD is suppressed.

In embodiments, fluorine may exist between multiple lattice points of the crystal lattice of the first silicon carbide region 10.

Figure 6:
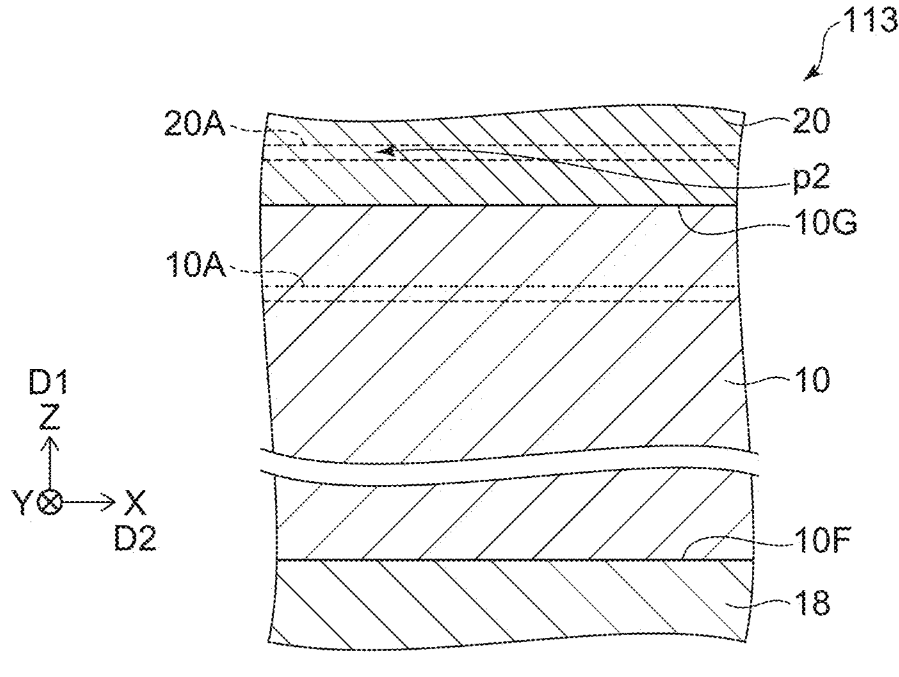
FIG. 6 is a schematic cross-sectional view illustrating a semiconductor device according to the first embodiment.

FIG. 6 is a schematic cross-sectional view illustrating a semiconductor device according to the first embodiment.

In a semiconductor device 113 according to the embodiment, at least a part of the second silicon carbide region 20 include fluorine. Except for this, the configuration of the semiconductor device 113 may be the same as the configuration of the semiconductor devices 110 to 112.

As shown in FIG. 6, in this example, the second silicon carbide region 20 includes a second local region 20A. The second local region 20A includes fluorine. For example, the second local region 20A may locally include fluorine.

In the semiconductor device 113, for example, it is possible to suppress the expansion of the stacking fault from above (surface side) of the second silicon carbide region 20. More stable characteristics can be obtained.

As shown in FIG. 6, for example, the second silicon carbide region 20 includes a second position p2 in the first direction D1. In the profile of the fluorine concentration C1 along the first direction D1, the fluorine concentration C1 may have a second peak value at the second position p2. In one example, the second peak value may be about not less than $1\times10^{16}$ $cm^{-3}$ and not more than $1\times10^{20}$ $cm^{-3}$.

For example, the second local region 20A includes the second position p2. Such a second local region 20A extends parallel to the plane (X-Y plane) crossing the first direction D1.

Figure 7:
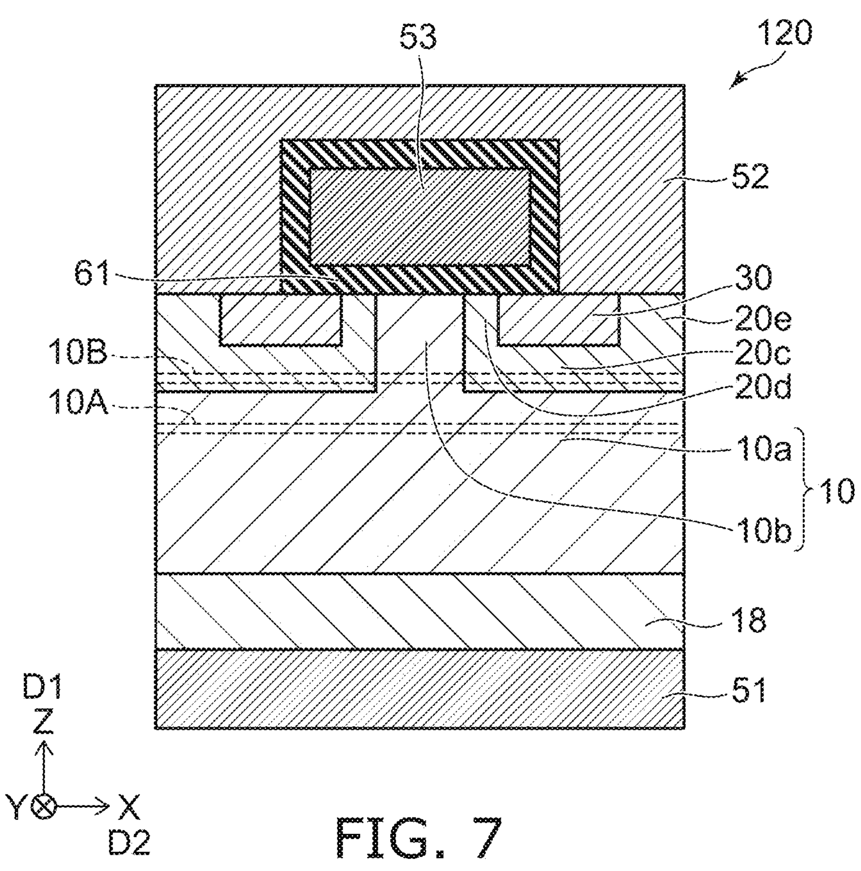
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, a semiconductor device 120 according to the embodiment includes a third silicon carbide region 30, a first electrode 51, a second electrode 52, a third electrode 53 and an insulating portion 61.

The third silicon carbide region 30 includes at least one selected from the group consisting of nitrogen, phosphorus and arsenic. The third silicon carbide region 30 includes SiC. The third silicon carbide region 30 is, for example, of the n-type.

A direction from the first electrode 51 to the second electrode 52 is along the first direction D1. The first silicon carbide region 10 includes a first partial region 10*a* and a second partial region 10*b*. The boundary of these partial regions may be clear or unclear.

The second silicon carbide region 20 includes a third partial region 20*c* and a fourth partial region 20*d*. The boundary of these partial regions may be clear or unclear.

The third partial region 20*c* is located between the first partial region 10*a* and the third silicon carbide region 30 in the first direction D1. A direction from the second partial region 10*b* to the third electrode 53 is along the first direction D1. The fourth partial region 20*d* is located between the second partial region 10*b* and the third silicon carbide region 30 in a second direction D2 crossing the first direction D1. The second direction D2 is, for example, the X-axis direction.

The first electrode 51 is electrically connected to the first silicon carbide region 10. The second electrode 52 is electrically connected to the third silicon carbide region 30. The insulating portion 61 is provided between the second partial region 10*b* and the third electrode 53.

In this example, the second silicon carbide region 20 further includes a fifth partial region 20*e*. The third silicon carbide region 30 is located between the fourth partial region 20*d* and the fifth partial region 20*e* in the second direction D2. The second electrode 52 is electrically connected to the fifth partial region 20*e*.

A current flowing between the first electrode 51 and the second electrode 52 can be controlled by a potential of the third electrode 53. The potential of the third electrode 53 may be, for example, a potential based on a potential of the second electrode 52. The third electrode 53 functions as a gate electrode. The semiconductor device 120 is, for example, a transistor.

In the semiconductor device 120, the first silicon carbide region 10 includes fluorine. The first silicon carbide region 10 includes the first local region 10A. The second silicon carbide region 20 may include fluorine. The second silicon carbide region 20 may include the second local region 20A. The expansion of the stacking fault is suppressed. Stable characteristics can be obtained.

In the semiconductor device 120, the base 18 may be of the n-type. In this case, the semiconductor device 120 is a MOSFET. For example, the first silicon carbide region 10 corresponds to, for example, a drift layer. The second silicon carbide region 20 corresponds to, for example, a p-well. The third silicon carbide region 30 corresponds to, for example, an $n^+$ source.

In the embodiment, the base 18 may be of the p-type. In this case, the semiconductor device 120 is an IGBT (Insulated Gate Bipolar Transistor).

The first silicon carbide region 10 and the second silicon carbide region 20 according to the embodiment may be applied to diodes and the like.

In the embodiment, the first local region 10A may include at least one selected from the group consisting of fluorine, nitrogen and phosphorus. For example, a semiconductor device according to an embodiment (e.g., semiconductor device 111 illustrated in FIG. 2) includes the base 18, the first silicon carbide region 10 and the second silicon carbide region 20. At least a part of the first silicon carbide region 10 includes a first element. The first element includes at least one selected from the group consisting of fluorine, nitrogen and phosphorus. The first silicon carbide region 10 includes the first position p1 in first direction D1 (see FIG. 2, for example). In the profile of the concentration of the first element along the first direction D1, the concentration of the first element has the first peak value pv1 at the first position p1. By locally providing not only fluorine but also nitrogen, phosphorus, or the like, the expansion of the stacking fault can be suppressed.

Second Embodiment

The second embodiment relates to a method for manufacturing the semiconductor device.

Figure 8:
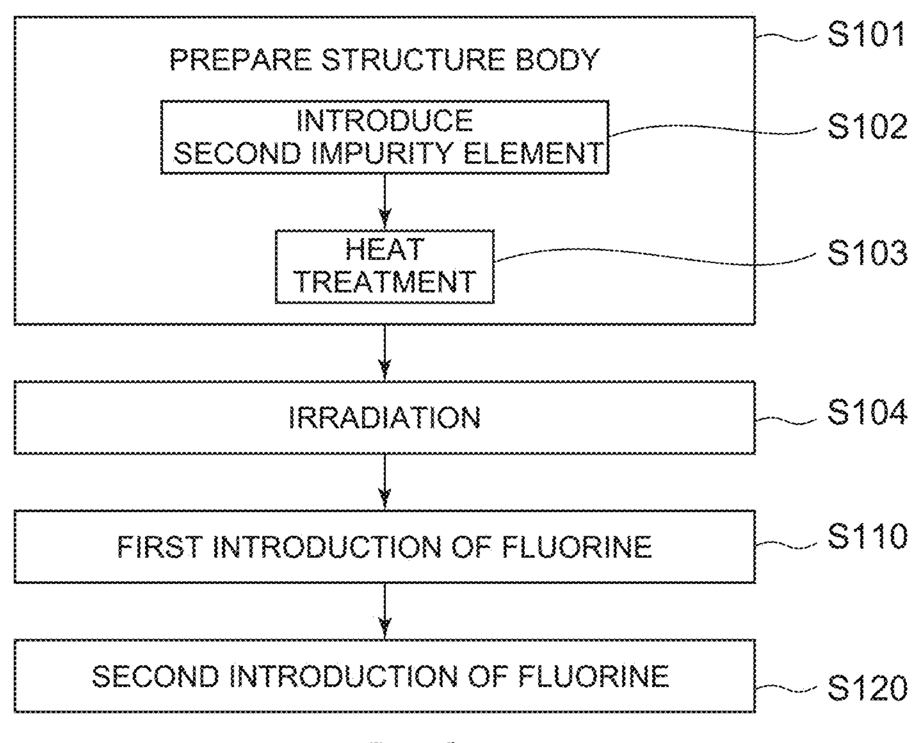
FIG. 8 is a flowchart illustrating a method for manufacturing a semiconductor device according to a second embodiment.

FIG. 8 is a flowchart illustrating a method for manufacturing a semiconductor device according to the second embodiment.

As shown in FIG. 8, in the method for manufacturing the semiconductor device according to the embodiment, a structure body 10X (see FIG. 1) is prepared (step S101), and fluorine is introduced (a first introduction of fluorine: step S110).

The structure body 10X includes the base 18, the first silicon carbide region 10 and the second silicon carbide region 20 (see FIG. 1). The first silicon carbide region 10 includes a first impurity element including at least one selected from the group consisting of nitrogen, phosphorus and arsenic. The second silicon carbide region 20 includes a second impurity element including at least one selected from the group consisting of boron, aluminum and gallium. The first silicon carbide region 10 is provided between the base 18 and the second silicon carbide region 20 in first direction D1 from the base 18 to first silicon carbide region 10.

Fluorine is introduced into the first silicon carbide region 10. The introduction of fluorine is performed, for example, by an ion implantation.

As a result, for example, the semiconductor devices 110 to 112 are obtained. It is possible to manufacture a semiconductor device capable of suppressing the expansion of the stacking fault.

The preparing the structure body 10X (step S101) may include introducing a second impurity element into a part of the silicon carbide layer serving as the first silicon carbide region 10 (step S102). The preparing the structure body 10X (step S101) may further include a heat treatment (step S103) after the introducing the second impurity element. The heat treatment conditions may be, for example, not less than 1600° C. and not more than 1900° C., and not less than 1 minute and not more than to 10 minutes. The heat treatment activates impurities, for example.

Before the introducing fluorine (step S110), at least a part of the first silicon carbide region 10 may be irradiated with at least one selected from the group consisting of hydrogen (protons), helium, and electrons (step S104). By the irradiating hydrogen (protons) or the like before the introducing fluorine, fluorine can be easily introduced into the desired position of the first silicon carbide region 10. For example, fluorine can be introduced with high controllability.

After the introducing fluorine (step S110), fluorine may be further introduced into the second silicon carbide region 20 (second introduction of fluorine: step S120). Thereby, for example, the second local region 20A can be formed. The stacking fault can be suppressed more effectively.

The embodiments may include the following configurations (for example, technical proposals).

Configuration 1

A semiconductor device, comprising:

a base;

a first silicon carbide region including at least one selected from the group consisting of nitrogen, phosphorus and arsenic; and a second silicon carbide region including at least one selected from the group consisting of boron, aluminum and gallium, the first silicon carbide region being provided between the base and the second silicon carbide region, at least a part of the first silicon carbide region including fluorine.

Configuration 2

The semiconductor device according to Configuration 1, wherein the first silicon carbide region includes a first position in a first direction from the base to the first silicon carbide region, and in a fluorine concentration profile along the first direction, a fluorine concentration has a first peak value at the first position.

Configuration 3

The semiconductor device according to Configuration 2, wherein the first peak value is not less than $1\times10^{16}$ $cm^{-3}$ and not more than $1\times10^{20}$ $cm^{-3}$.

Configuration 4

The semiconductor device according to Configuration 2 or 3, wherein the first silicon carbide region includes a first local region, the first local region includes the first position, and the first local region extends parallel to a plane crossing the first direction.

Configuration 5

The semiconductor device according to Configuration 4, wherein the fluorine concentration in the first local region is not less than 1/10 times the first peak value, and a width of the first local region in the first direction is 0.5 μm or less.

Configuration 6

The semiconductor device according to Configuration 2 or 3, wherein the first silicon carbide region includes a plurality of first local regions, at least one of the plurality of first local regions includes the first position, and the plurality of first local regions are provided along a plane crossing the first direction.

Configuration 7

The semiconductor device according to Configuration 6, wherein the first silicon carbide region includes a first face facing the base, and an angle θ, a thickness d, and a distance w satisfy a relationship of $w<(d/(\tan\theta))$, the angle θ being between a (0001) plane of the first silicon carbide region and the first face, the thickness d being a thickness of the plurality of first local regions along the first direction, and the distance w being a distance between the plurality of first local regions along a second direction crossing the first direction.

Configuration 8

The semiconductor device according to any one of Configurations 1-7, wherein the fluorine exists between a plurality of lattice points of a crystal lattice of the first silicon carbide region.

Configuration 9

The semiconductor device according to Configuration 1, wherein at least a part of the second silicon carbide region includes fluorine.

Configuration 10

The semiconductor device according to Configuration 9, wherein the second silicon carbide region includes a second position in a first direction from the base to the first silicon carbide region, and in a fluorine concentration profile along the first direction, a fluorine concentration has a second peak value at the second position.

Configuration 11

The semiconductor device according to Configuration 10, wherein the second peak value is not less than $1\times10^{16}$ $cm^{-3}$ and not more than $1\times10^{20}$ $cm^{-3}$.

Configuration 12

The semiconductor device according to Configuration 10 or 11, wherein the second silicon carbide region includes a second local region, the second local region includes the second position, and the second local region extends parallel to a plane crossing the first direction.

Configuration 13

The semiconductor device according to Configuration 4 or 5, wherein a stacking fault is configured to expand between the base and the first local region by at least one of a voltage application or an ultraviolet irradiation, and the stacking fault is configured not to substantially expand between the first local region and the second silicon carbide region by the at least one of the voltage application or the ultraviolet irradiation.

Configuration 14

The semiconductor device according to any one of Configurations 2-6, further comprising:

a third silicon carbide region;

a first electrode;

a second electrode;

a third electrode; and an insulating portion, the third silicon carbide region including at least one selected from the group consisting of nitrogen, phosphorus and arsenic, a direction from the first electrode to the second electrode being along the first direction, the first silicon carbide region including a first partial region and a second partial region, the second silicon carbide region including a third partial region and a fourth partial region, the third partial region being located between the first partial region and the third silicon carbide region in the first direction, a direction from the second partial region to the third electrode being along the first direction, the fourth partial region being located between the second partial region and the third silicon carbide region in a second direction crossing the first direction, the first electrode being electrically connected to the first silicon carbide region, the second electrode being electrically connected to the third silicon carbide region, and the insulating portion being provided between the second partial region and the third electrode.

Configuration 15

The semiconductor device according to Configuration 14, wherein the second silicon carbide region further includes a fifth partial region, the third silicon carbide region is located between the fourth partial region and the fifth partial region in the second direction, and the second electrode is electrically connected to the fifth partial region.

Configuration 16

A semiconductor device, comprising:

a base;

a first silicon carbide region including a first impurity element, the first impurity element including at least one selected from the group consisting of nitrogen, phosphorus and arsenic; and a second silicon carbide region including at least one selected from the group consisting of boron, aluminum and gallium, the first silicon carbide region being provided between the base and the second silicon carbide region in a first direction from the base to the first silicon carbide region, at least a part of the first silicon carbide region including a first element, the first element including at least one selected from the group consisting of fluorine, nitrogen and phosphorus, the first silicon carbide region includes a first position in the first direction, and in a profile of a concentration of the first element along the first direction, a concentration of the first element has a first peak value at the first position.

Configuration 17

A method for manufacturing a semiconductor device, the method comprising:

preparing a structure body, the structure body including a base, a first silicon carbide region and a second silicon carbide region, the first silicon carbide region including a first impurity element, the first impurity element including at least one selected from the group consisting of nitrogen, phosphorus and arsenic, the second silicon carbide region including a second impurity element, the second impurity element including at least one selected from the group consisting of boron, aluminum and gallium, the first silicon carbide region being provided between the base and the second silicon carbide region in a first direction from the base to the first silicon carbide region; and introducing fluorine into the first silicon carbide region.

Configuration 18

The method for manufacturing the semiconductor device according to Configuration 17, wherein the preparing the structure body includes introducing the second impurity element into a part of the silicon carbide layer serving as the first silicon carbide region, and performing a heat treatment after the introducing the second impurity element.

Configuration 19

The method for manufacturing the semiconductor device according to Configuration 17 or 18, further comprising:

irradiating at least part of the first silicon carbide region with at least one selected from the group consisting of hydrogen, helium and electron prior to the introducing the fluorine.

Configuration 20

The method for manufacturing the semiconductor device according to any one of Configurations 17-19, further comprising:

introducing fluorine into the second silicon carbide region.

According to the embodiments, it is possible to provide a semiconductor device capable of stabilizing characteristics and a method of manufacturing the same.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as bases, silicon carbide regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor device and methods of manufacturing the same practicable by an appropriate design modification by one skilled in the art based on the semiconductor device and methods of manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a base;

a first silicon carbide region including at least one selected from the group consisting of nitrogen, phosphorus and arsenic; and a second silicon carbide region including at least one selected from the group consisting of boron, aluminum and gallium, the first silicon carbide region being provided between the base and the second silicon carbide region, at least a part of the first silicon carbide region including fluorine, wherein the first silicon carbide region includes a first position in a first direction from the base to the first silicon carbide region, in a fluorine concentration profile along the first direction, a fluorine concentration has a first peak value at the first position, the first silicon carbide region includes a plurality of first local regions, at least one of the plurality of first local regions includes the first position, the plurality of first local regions are provided along a plane crossing the first direction, the first silicon carbide region includes a first face facing the base, and an angle θ, a thickness d, and a distance w satisfy a relationship of $w<(d/(\tan\theta))$, the angle θ being between a (0001) plane of the first silicon carbide region and the first face, the thickness d being a thickness of the plurality of first local regions along the first direction, and the distance w being a distance between the plurality of first local regions along a second direction crossing the first direction.

2. The device according to claim 1, wherein the first peak value is not less than $1\times10^{16}$ $cm^{-3}$ and not more than $1\times10^{20}$ $cm^{-3}$.

3. The device according to claim 1, wherein the first silicon carbide region includes a first local region, the first local region includes the first position, and the first local region extends parallel to a plane crossing the first direction.

4. The device according to claim 3, wherein the fluorine concentration in the first local region is not less than 1/10 times the first peak value, and a width of the first local region in the first direction is 0.5 μm or less.

5. The device according to claim 1, wherein the fluorine exists between a plurality of lattice points of a crystal lattice of the first silicon carbide region.

6. The device according to claim 1, wherein at least a part of the second silicon carbide region includes fluorine.

7. The device according to claim 6, wherein the second silicon carbide region includes a second position in a first direction from the base to the first silicon carbide region, and in a fluorine concentration profile along the first direction, a fluorine concentration has a second peak value at the second position.

8. The device according to claim 7, wherein the second peak value is not less than $1\times10^{16}$ $cm^{-3}$ and not more than $1\times10^{20}$ $cm^{-3}$.

9. The device according to claim 7, wherein the second silicon carbide region includes a second local region, the second local region includes the second position, and the second local region extends parallel to a plane crossing the first direction.

10. The device according to claim 3, wherein a stacking fault is configured to expand between the base and the first local region by at least one of a voltage application or an ultraviolet irradiation, and the stacking fault is configured not to substantially expand between the first local region and the second silicon carbide region by the at least one of the voltage application or the ultraviolet irradiation.

11. A semiconductor device, comprising:

a base;

a first silicon carbide region including at least one selected from the group consisting of nitrogen, phosphorus and arsenic, at least a part of the first silicon carbide region including fluorine;

a second silicon carbide region including at least one selected from the group consisting of boron, aluminum and gallium, the first silicon carbide region being provided between the base and the second silicon carbide region;

a third silicon carbide region;

a first electrode;

a second electrode;

a third electrode; and an insulating portion, wherein the first silicon carbide region includes a first position in a first direction from the base to the first silicon carbide region, in a fluorine concentration profile along the first direction, a fluorine concentration has a first peak value at the first position, the third silicon carbide region includes at least one selected from the group consisting of nitrogen, phosphorus and arsenic, a direction from the first electrode to the second electrode is along the first direction, the first silicon carbide region includes a first partial region and a second partial region, the second silicon carbide region includes a third partial region and a fourth partial region, the third partial region is located between the first partial region and the third silicon carbide region in the first direction, a direction from the second partial region to the third electrode is along the first direction, the fourth partial region is located between the second partial region and the third silicon carbide region in a second direction crossing the first direction, the first electrode is electrically connected to the first silicon carbide region, the second electrode is electrically connected to the third silicon carbide region, and the insulating portion is provided between the second partial region and the third electrode.

12. The device according to claim 11, wherein the second silicon carbide region further includes a fifth partial region, the third silicon carbide region is located between the fourth partial region and the fifth partial region in the second direction, and the second electrode is electrically connected to the fifth partial region.

13. A method for manufacturing a semiconductor device, the method comprising:

preparing a structure body, the structure body including a base, a first silicon carbide region and a second silicon carbide region, the first silicon carbide region including a first impurity element, the first impurity element including at least one selected from the group consisting of nitrogen, phosphorus and arsenic, the second silicon carbide region including a second impurity element, the second impurity element including at least one selected from the group consisting of boron, aluminum and gallium, the first silicon carbide region being provided between the base and the second silicon carbide region in a first direction from the base to the first silicon carbide region;

introducing fluorine into the first silicon carbide region; and irradiating at least part of the first silicon carbide region with at least one selected from the group consisting of hydrogen, helium and electron prior to the introducing the fluorine.

14. The method according to claim 13, wherein the preparing the structure body includes introducing the second impurity element into a part of the silicon carbide layer serving as the first silicon carbide region, and performing a heat treatment after the introducing the second impurity element.

15. The method according to claim 13, further comprising:

introducing fluorine into the second silicon carbide region.

* * * * *